United States Patent
Suwa et al.

(10) Patent No.: US 10,669,369 B2
(45) Date of Patent: Jun. 2, 2020

(54) LONG-CHAIN ALKYLENE GROUP-CONTAINING EPOXY RESIN COMPOSITION

(71) Applicant: NISSAN CHEMICAL INDUSTRIES, LTD., Tokyo (JP)

(72) Inventors: Takeshi Suwa, Funabashi (JP); Yuki Endo, Funabashi (JP); Sayoko Tadokoro, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/775,132

(22) PCT Filed: Nov. 10, 2016

(86) PCT No.: PCT/JP2016/083398
§ 371 (c)(1),
(2) Date: May 10, 2018

(87) PCT Pub. No.: WO2017/082356
PCT Pub. Date: May 18, 2017

(65) Prior Publication Data
US 2018/0340040 A1 Nov. 29, 2018

(30) Foreign Application Priority Data
Nov. 10, 2015 (JP) ................................. 2015-220569

(51) Int. Cl.
| | |
|---|---|
| C08G 59/32 | (2006.01) |
| H05K 1/03 | (2006.01) |
| C08L 63/06 | (2006.01) |
| C08G 59/02 | (2006.01) |
| C08G 59/40 | (2006.01) |
| C08G 59/42 | (2006.01) |
| C08G 59/44 | (2006.01) |
| C08G 59/66 | (2006.01) |
| C08L 63/00 | (2006.01) |

(52) U.S. Cl.
CPC ....... *C08G 59/3245* (2013.01); *C08G 59/027* (2013.01); *C08G 59/32* (2013.01); *C08G 59/4064* (2013.01); *C08G 59/42* (2013.01); *C08G 59/44* (2013.01); *C08G 59/66* (2013.01); *C08L 63/00* (2013.01); *C08L 63/06* (2013.01); *H05K 1/03* (2013.01); *C08L 2203/202* (2013.01)

(58) Field of Classification Search
None
See application file for complete search history.

(56) References Cited

U.S. PATENT DOCUMENTS

2011/0319589 A1* 12/2011 Takeyama .......... C08G 59/3236
528/363

FOREIGN PATENT DOCUMENTS

| EP | 2 530 098 A1 | 12/2012 |
|---|---|---|
| EP | 2 602 257 A1 | 6/2013 |
| JP | 2008-7782 A | 1/2008 |
| JP | 2010-285624 A | 12/2010 |
| JP | 2012-025688 A | 2/2012 |
| WO | 2010/092947 A1 | 8/2010 |
| WO | 2016/027735 A1 | 2/2016 |
| WO | 2017/170483 A1 | 10/2017 |
| WO | 2018/074517 A1 | 4/2018 |

OTHER PUBLICATIONS

Feb. 14, 2017 International Search Report issued in International Patent Application PCT/JP2016/083398.
Feb. 14, 2017 Written Opinion issued in International Patent Application PCT/JP2016/083398.
Kentaro Omori; "The High Reliability Optical Material Based on the Isocyanuric Acid"; Kobunishi; Jul. 1, 2015; vol. 64; No. 7; pp. 435-436.
Jul. 1, 2019 Extended European Search Report issued in European Applicatio No. 16864317.9.

* cited by examiner

*Primary Examiner* — Megan McCulley
(74) *Attorney, Agent, or Firm* — Oliff PLC

(57) ABSTRACT

There is provided an epoxy resin composition containing an epoxy compound, which has a low viscosity and a low dielectric constant, and when added to a general-purpose epoxy resin composition, can lower a viscosity of the composition and can sufficiently lower a dielectric constant of an epoxy resin cured product obtained from the composition. An epoxy resin composition comprising: (a) an epoxy component containing at least an epoxy compound of formula [1]; and (b) a curing agent:

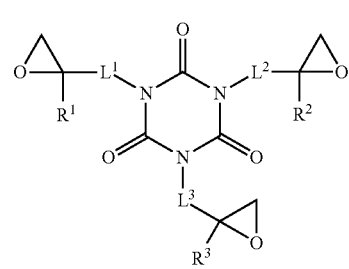

[1]

wherein $R^1$ to $R^3$ each independently are a hydrogen atom or methyl group, and $L^1$ to $L^3$ each independently are pentamethylene group, hexamethylene group or heptamethylene group.

7 Claims, No Drawings

LONG-CHAIN ALKYLENE GROUP-CONTAINING EPOXY RESIN COMPOSITION

TECHNICAL FIELD

The present invention relates to a long-chain alkylene group-containing epoxy resin composition.

BACKGROUND ART

An epoxy resin is conventionally widely used, in the form of an epoxy resin composition in combination with a curing agent or a curing catalyst, in the fields of electronic materials such as an adhesive, a high refractive index layer of an anti-reflective coating (such as an anti-reflective coating for a liquid crystal display), an optical thin film (such as a reflector), a sealant for an electronic component, a printed wiring board and an interlayer insulating film material (such as an interlayer insulating film material for a build-up printed board). In the fields of these electronic materials, in application to a printed wiring board or an interlayer insulating film material, a low dielectric constant is required, in addition to high adhesiveness to a substrate, a hard coating property, heat resistance, high transparency to visible light and the like, in recent years for inhibiting electric signal delay or adjusting capacitance of an electronic device.

For obtaining reliability such as heat resistance and light resistance required of such an electronic material, an epoxy compound needs to have a rigid molecular skeleton. In general, however, a compound having a rigid molecular skeleton and having high interaction between molecules is likely to be in the form of a solid or a high viscosity liquid. Therefore, an epoxy resin composition using an epoxy compound having a rigid molecular skeleton has a problem of poor handleability because of the increased viscosity.

In particular, in the fields of semiconductors and liquid crystals further refined in recent years, a resin layer of an epoxy resin or the like is coated, in many cases, on an upper layer having a fine irregular structure formed by lithography or nanoimprint. If a used epoxy resin composition has a high liquid viscosity, however, the resin composition cannot bury the fine irregular structure when coated, which adversely affects a process performed thereafter.

Besides, in addition to the aforementioned properties, a low dielectric constant is required in recent years for inhibiting electric signal delay or adjusting capacitance of an electronic device. An epoxy resin cured product has high polarity in general, however, and hence it is difficult to attain a sufficiently low dielectric constant.

As a liquid epoxy compound for obtaining an epoxy resin cured product having high heat resistance, high transparency and the like, an epoxy compound having an isocyanurate skeleton is conventionally known (for example, Patent Document 1).

Besides, as a method for lowering a dielectric constant of an epoxy resin cured product, a method for lowering a dielectric constant of a cured product in which a hollow particle is added to an epoxy resin composition for causing a cured product obtained from the composition to include an air layer is known (for example, Patent Document 2).

PRIOR ART DOCUMENTS

Patent Documents

Patent Document 1: International Publication No. WO2010/092947

Patent Document 2: Japanese Patent Application Publication No. 2010-285624 (JP 2010-285624 A)

SUMMARY OF THE INVENTION

Problem to be Solved by the Invention

The epoxy compound used in Patent Document 1 is, however, in the form of a liquid but has a viscosity of about 8,000 mPa·s, which cannot be a sufficiently low viscosity in consideration of accuracy and processability necessary in the fields of film thinning and fine processing of recent years.

Besides, when the method described in Patent Document 2 is employed, the hollow particle is added to the composition. Therefore, an optical property, a mechanical property, a thermal property and the like of a base resin are changed, which may adversely affect material design.

An object of the present invention is to provide an epoxy resin composition containing an epoxy compound, which has a low viscosity and a low dielectric constant, and when added to a general-purpose epoxy resin composition, can lower a viscosity of the composition and can sufficiently lower a dielectric constant of an epoxy resin cured product obtained from the composition.

Means for Solving the Problem

The present inventors earnestly made a thorough study to solve the above-described problem, resulting in finding that an epoxy compound having a specific structure is a liquid compound having an extremely low viscosity as compared with conventional liquid epoxy compounds, and that a cured product obtained from an epoxy resin composition containing the epoxy compound exhibits a low dielectric constant, and thus, the present invention was accomplished.

Specifically, the present invention relates to, as the first aspect, an epoxy resin composition including: (a) an epoxy component containing at least an epoxy compound of formula [1]; and (b) a curing agent:

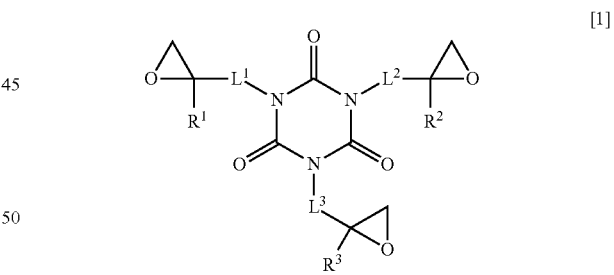

[1]

wherein $R^1$ to $R^3$ each independently are a hydrogen atom or methyl group, and $L^1$ to $L^3$ each independently are pentamethylene group, hexamethylene group or heptamethylene group.

The present invention relates to, as the second aspect, the epoxy resin composition according to the first aspect, wherein $R^1$ to $R^3$ are hydrogen atoms.

The present invention relates to, as the third aspect, the epoxy resin composition according to the first or second aspect, wherein (b) the curing agent is at least one selected from the group consisting of an acid anhydride, an amine, a phenol resin, a polyamide resin, imidazoles and a polymercaptan.

The present invention relates to, as the fourth aspect, the epoxy resin composition according to the third aspect, wherein (b) the curing agent is an acid anhydride.

The present invention relates to, as the fifth aspect, the epoxy resin composition according to any one of the first to fourth aspects, wherein (b) the curing agent is contained in a proportion of 0.5 to 1.5 equivalents per equivalent of epoxy group of (a) the epoxy component.

The present invention relates to, as the sixth aspect, a composition for coating a metal wiring, including the epoxy resin composition according to any one of the first to fifth aspects.

The present invention relates to, as the seventh aspect, a cured product of the epoxy resin composition according to any one of the first to fifth aspects.

The present invention relates to, as the eighth aspect, a wiring board, including a cured product of the epoxy resin composition according to any one of the first to fifth aspects, and a metal wiring, wherein the cured product and the metal wiring are in contact with each other.

Effects of the Invention

An epoxy compound used in the present invention has a low viscosity because it has straight chain alkylene group having a carbon atom number of 5 to 7 in a binding portion between an isocyanurate skeleton and epoxy group. In addition, a cured product having a low dielectric constant can be obtained from an epoxy resin composition containing the epoxy compound and a curing agent or a curing catalyst.

Furthermore, the epoxy compound used in the present invention is cured through a reaction with a conventional curing agent or an acid or a base generated from a conventional curing agent or curing catalyst. Therefore, the epoxy compound can be added to a general-purpose epoxy resin composition. Besides, when the epoxy compound used in the present invention is added to an epoxy resin composition, a viscosity of the composition is lowered, and a dielectric constant of an epoxy resin cured product obtained from the composition can be made lower than a dielectric constant of an epoxy resin cured product obtained from an epoxy resin composition not containing the epoxy compound.

MODES FOR CARRYING OUT THE INVENTION

<Epoxy Resin Composition>

An epoxy resin composition of the present invention includes: (a) an epoxy component containing at least an epoxy compound of the above formula [1]; and (b) a curing agent.

[(a) Epoxy Component]

The epoxy component used in the present invention contains at least the epoxy compound of the following formula [1]:

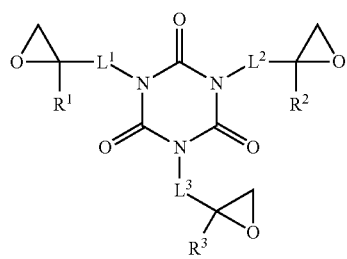

[1]

In the formula, $R^1$ to $R^3$ each independently are a hydrogen atom or methyl group, and $L^1$ to $L^3$ each independently are pentamethylene group, hexamethylene group or heptamethylene group.

Any of the $R^1$ to $R^3$ is preferably a hydrogen atom, and more preferably, all the $R^1$ to $R^3$ are hydrogen atoms.

Besides, any of the $L^1$ to $L^3$ is preferably hexamethylene group, and more preferably, all the $L^1$ to $L^3$ are hexamethylene group.

It is particularly preferable that all the $R^1$ to $R^3$ be hydrogen atoms, and that all the $L^1$ to $L^3$ be hexamethylene group.

The compound of the formula [1] can be produced by a conventional epoxide synthesis method (described in, for example, International Publication No. WO2010/092947, Japanese Patent Application Publication No. 2012-25688 and the like) using, as a starting material, isocyanuric acid and an olefin compound having a leaving group X.

Specifically, isocyanuric acid and an olefin compound represented by $CH_2=CR^1-L^1-X$ are reacted with each other to produce a compound (an intermediate) having an unsaturated bond, and then, the compound (the intermediate) is reacted with a peroxide to produce the epoxy compound of the formula [1]. An exemplified synthesis scheme will be shown below.

The leaving group X is not especially limited as long as it is a group reacted with N—H group of isocyanuric acid, and examples thereof include hydroxy group, methanesulfonyloxy group, trifluoromethanesulfonyloxy group, toluenesulfonyloxy group, nitrobenzenesulfonyloxy group, acetoxy group, trifluoroacetoxy group and a halogen atom.

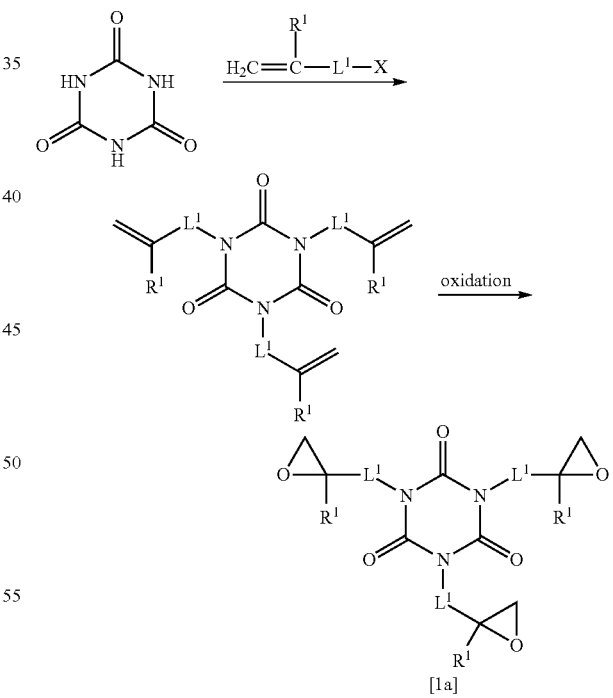

[1a]

In the formula, $R^1$, $L^1$ and X respectively have the same meaning as defined above.

In the present invention, the epoxy compound of the formula [1] can be used together with a different epoxy compound. The epoxy compound of the formula [1] and the different epoxy compound can be used in a molar ratio of epoxy group of 1:0 to 1:20.

The epoxy compound different from the epoxy compound of the formula [1] is not especially limited, and any of various commercially available polyfunctional epoxy compounds can be used.

Examples of the epoxy compound usable in the present invention include, but are not limited to, 1,4-butanediol diglycidyl ether, 1,6-hexanediol diglycidyl ether, (poly)ethylene glycol diglycidyl ether, (poly)propylene glycol diglycidyl ether, trimethylolethane triglycidyl ether, trimethylolpropane triglycidyl ether, 1,4-cyclohexanedimethanol diglycidyl ether, 1,2-epoxy-4-(epoxyethyl)cyclohexane, glycerol triglycidyl ether, diglycerol polyglycidyl ether, 2,6-diglycidylphenyl glycidyl ether, 1,1,3-tris(4-glycidyloxyphenyl)propane, diglycidyl 1,2-cyclohexanedicarboxylate, 4,4'-methylenebis(N,N-diglycidylaniline), (3,4-epoxycyclohexyl)methyl 3,4-epoxycyclohexanecarboxylate, N,N-diglycidyl-4-glycidyloxyaniline (triglycidyl-p-aminophenol), N,N,N',N'-tetraglycidyl-m-xylylenediamine (tetraglycidyl-meta-xylenediamine), 4,4'-methylenebis(N,N-diglycidylaniline) (tetraglycidyl-diaminodiphenylmethane), 1,3-bis(N,N-diglycidylaminomethyl)cyclohexane (tetraglycidyl-1,3-bis(aminomethyl)cyclohexane), bisphenol A diglycidyl ether, bisphenol F diglycidyl ether, bisphenol S diglycidyl ether, tetrabromo bisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoroacetone diglycidyl ether, triglycidyl isocyanurate, tris(3,4-epoxybutyl) isocyanurate, tris(4,5-epoxypentyl) isocyanurate, tris(5,6-epoxyhexyl) isocyanurate, tris(2-glycidyloxyethyl) isocyanurate, monoallyl diglycidyl isocyanurate, N,N'-diglycidyl N"-(2,3-dipropionyloxypropyl) isocyanurate, N,N'-bis(2,3-dipropionyloxypropyl) N'-glycidyl isocyanurate, tris(2,2-bis(glycidyloxymethyl)butyl) 3,3',3"-(2,4,6-trioxo-1,3,5-triazine-1,3,5-triyl)tripropanoate, sorbitol polyglycidyl ether, diglycidyl adipate,-diglycidylophthalate, dibromophenyl glycidyl ether, 1,2,7,8-diepoxyoctane, 1,6-dimethylolperfluorohexane diglycidyl ether, 4-(spiro[3,4-epoxycyclohexane-1,5'-[1,3]dioxane]-2'-yl)-1,2-epoxycyclohexane, 1,2-bis(3,4-epoxycyclohexylmethoxy)ethane, 4,5-epoxy-2-methylcyclohexylmethyl 4,5-epoxy-2-methylcyclohexane carboxylate, ethylene glycol bis(3,4-epoxycyclohexanecarboxylate), bis(3,4-epoxycyclohexylmethyl) adipate and bis(2,3-epoxycyclopentyl) ether.

A single one of, or a mixture of two or more of these epoxy compounds can be used.

Examples of the epoxy compound include the following commercially available compounds.

Examples of the epoxy compound in a solid form include TEPIC®-G, -S, -L and -HP [all manufactured by Nissan Chemical Industries, Ltd.].

Examples of the epoxy compound in a liquid form include TEPIC®-PAS B22, -PAS B26, -PAS B26L, -VL, and -UC [all manufactured by Nissan Chemical Industries, Ltd.], jER® 828, 807 and YX8000 [all manufactured by Mitsubishi Chemical Corporation], Ricaresin® DME100 [manufactured by New Japan Chemical Co., Ltd.] and Celloxide 2021P [manufactured by Daicel Corporation].

[(b) Curing Agent]

As the curing agent to be used in the present invention, an acid anhydride, an amine, a phenol resin, a polyamide resin, imidazoles or a polymercaptan can be used. Among these, an acid anhydride and an amine are particularly preferred. Such a curing agent even in a solid form can be used when it is dissolved in a solvent. It is, however, apprehended that the density of the resultant cured product may be lowered or pores may be generated through evaporation of the solvent to degrade strength or degrade water resistance, and therefore, a curing agent in a liquid form at normal temperature under normal pressure is preferred.

The curing agent can be contained in a proportion of 0.5 to 1.5 equivalents, and preferably 0.8 to 1.2 equivalents per equivalent of epoxy group of the epoxy component. The equivalent of the curing agent to the epoxy component is shown as an equivalent ratio of a curable group of the curing agent to the epoxy group. It is noted that when the epoxy compound of the formula [1] and a different epoxy compound are used together, the equivalent to epoxy group of all the epoxy compounds falls in the above-described range.

As the acid anhydride, an acid anhydride of a compound having a plurality of carboxyl groups in one molecule is preferred. Examples of such an acid anhydride include phthalic anhydride, trimellitic anhydride, pyromellitic anhydride, benzophenonetetracarboxylic anhydride, ethylene glycol bistrimellitate, glycerol tristrimellitate, maleic anhydride, 1,2,3,6-tetrahydrophthalic anhydride (tetrahydrophthalic anhydride), 4-methyl-1,2,3,6-tetrahydrophthalic anhydride (methyltetrahydrophthalic anhydride), 3,6-endomethylene-1,2,3,6-tetrahydrophthalic anhydride (endomethylenetetrahydrophthalic anhydride), 4-methyl-3,6-endomethylene-1,2,3,6-tetrahydrophthalic anhydride (methylendomethylenetetrahydrophthalic anhydride, 5-methylnorborna-5-ene-2,3-dicarboxylic anhydride, methylnadic anhydride, methylhimic anhydride), 5-methylbicyclo[2.2.1]heptane-2,3-dicarboxylic anhydride (hydrogenated methylnadic anhydride), 3-(2-methylbut-2-en-1-yl)-1,2,3,6-tetrahydrophthalic anhydride (methylbutenyltetrahydrophthalic anhydride), dodecenylsuccinic anhydride, hexahydrophthalic anhydride, 4-methylhexahydrophthalic anhydride (methylhexahydrophthalic anhydride), succinic anhydride, 3-methyl-1,2,3,6-tetrahydrophthalic anhydride (methylcyclohexenedicarboxylic anhydride) and chlorendic anhydride.

Among these, 4-methyl-1,2,3,6-tetrahydrophthalic anhydride (methyltetrahydrophthalic anhydride), 4-methyl-3,6-endomethylene-1,2,3,6-tetrahydrophthalic anhydride (methylendomethylenetetrahydrophthalic anhydride, 5-methylnorborna-5-ene-2,3-dicarboxylic anhydride, methylnadic anhydride, methylhimic anhydride), 5-methylbicyclo[2.2.1]heptane-2,3-dicarboxylic anhydride (hydrogenated methylnadic anhydride), 3-(2-methylbut-2-en-1-yl)-1,2,3,6-tetrahydrophthalic anhydride (methylbutenyltetrahydrophthalic anhydride), dodecenylsuccinic anhydride, 4-methylhexahydrophthalic anhydride (methylhexahydrophthalic anhydride), and a mixture of 4-methylhexahydrophthalic anhydride (methylhexahydrophthalic anhydride) and hexahydrophthalic anhydride, which are in the form of a liquid at normal temperature and normal pressure, are preferred. Such a liquid acid anhydride has a viscosity measured at 25° C. of about 10 to 1,000 mPa·s. As for acid anhydride group, one acid anhydride group is counted as 1 equivalent.

Examples of preferred amine include piperidine, N,N-dimethylpiperazine, triethylenediamine, 2,4,6-tris(dimethylaminomethyl)phenol, benzyldimethylamine, 2-(dimethylaminomethyl)phenol, diethylenetriamine, triethylenetetramine, tetraethylenepentamine, diethylaminopropylamine, N-aminoethylpiperazine, di(1-methyl-2-aminocyclohexyl)methane, menthanediamine, isophoronediamine, diaminodicyclohexylmethane, 1,3-bis(aminomethyl)cyclohexane, xylenediamine, meta-phenylenediamine, diaminodiphenylmethane and diaminodiphenylsulfone. Among these, diethylenetriamine, triethylenetetramine, tetraethylenepentamine, diethylaminopropylamine, N-amino ethylpiperazine, di(1-methyl-2-aminocyclohexyl)methane, menthanediamine, isophoronediamine and diaminodicyclohexylmethane which are liquid can be preferably used.

Examples of the phenol resin includes a phenol novolac resin and a cresol novolac resin.

The polyamide resin is generated through condensation of dimer acid and polyamine, and is a polyamidoamine having a primary amine and a secondary amine in a molecule.

Examples of the imidazoles include 2-methylimidazole, 2-ethyl-4-methylimidazole, 1-cyanoethyl-2-undecylimidazolium trimellitate and an epoxy imidazole adduct.

Examples of the polymercaptan include one having mercaptan group at an end of a polypropylene glycol chain, and one having mercaptan group at an end of a polyethylene glycol chain, and one in the form of a liquid is preferred.

Besides, in obtaining a cured product from the epoxy resin composition of the present invention, a curing accelerator (also designated as a curing aid) may be used together.

Examples of the curing accelerator include an organic phosphorus compound such as triphenylphosphine or tributylphosphine; a quaternary phosphonium salt such as ethyltriphenylphosphonium bromide or tetrabutylphosphonium 0,0-diethyl phosphorodithioate; and a quaternary ammonium salt such as 1,8-diazabicyclo[5.4.0]undeca-7-ene, a salt of 1,8-diazabicyclo[5.4.0]undeca-7-ene and octylic acid, zinc octylate or tetrabutylammonium bromide. Alternatively, the imidazoles such as 2-methylimidazole or 2-ethyl-4-methylimidazole and the amine such as 2,4,6-tris(dimethylaminomethyl)phenol or benzyldimethylamine mentioned above as the examples of the curing agent can be used as a curing accelerator for a different type of curing agent.

The curing accelerator can be used in a proportion of 0.001 parts by mass to 0.1 parts by mass with respect to 1 part by mass of the curing agent.

[(c) Curing Catalyst]

The epoxy resin composition of the present invention may contain (c) the curing catalyst instead of (b) the curing agent or in addition to (b) the curing agent. The curing catalyst contains (c1) an acid generator and/or (c2) a base generator. Thus, even when the epoxy component used in the present invention is mixed with the curing catalyst, curing does not immediately occur, and therefore, storage stability is excellent and sufficient working time can be obtained.

<(c1) Acid Generator>

As (c1) the acid generator, a photoacid generator or a thermal acid generator can be used. The photoacid generator or the thermal acid generator is not especially limited as long as it generates an acid (a Lewis acid or a Bronsted acid) directly or indirectly by light irradiation or heating. An epoxy resin composition containing a thermal acid generator can be cured by heating in a short time. Alternatively, an epoxy resin composition containing a photoacid generator is cured by light irradiation rather than heating, and hence can be used in a substrate or a portion having low heat resistance.

Specific examples of the photoacid generator include an onium salt such as an iodonium salt, a sulfonium salt, a phosphonium salt or a selenium salt, a metallocene complex compound, an iron arene complex compound, a disulfone-based compound, a sulfonic acid derivative compound, a triazine-based compound, an acetophenone derivative compound and a diazomethane-based compound.

Examples of the iodonium salt include diaryliodonium salts, such as a chloride, a bromide, a mesylate, a tosylate, a trifluoromethanesulfonate, a tetrafluoroborate, a tetrakis (pentafluorophenyl)borate, a hexafluorophosphate, a hexafluoroarsenate and a hexafluoroantimonate, of iodoniums, such as diphenyliodonium, 4,4'-dichlorodiphenyliodonium, 4,4'-dimethoxydiphenyliodonium, 4,4'-di-tert-butyldiphenyliodonium, 4-methylphenyl(4-(2-methylpropyl)phenyl)iodonium, 3,3'-dinitrophenyliodonium, 4-(1-ethoxycarbonylethoxy)phenyl(2,4,6-trimethylphenyl)iodonium and 4-methoxyphenyl(phenyl)iodonium.

Examples of the sulfonium salt include triarylsulfonium salts, such as a chloride, a bromide, a trifluoromethanesulfonate, a tetrafluoroborate, a hexafluorophosphate, a hexafluoroarsenate and a hexafluoroantimonate, of sulfoniums, such as triphenylsulfonium, diphenyl(4-tert-butylphenyl)sulfonium, tris(4-tert-butylphenyl)sulfonium, diphenyl(4-methoxyphenyl)sulfonium, tris(4-methylphenyl)sulfonium, tris(4-methoxyphenyl)sulfonium, tris(4-ethoxyphenyl)sulfonium, diphenyl(4-(phenylthio)phenyl)sulfonium and tris(4-(phenylthio)phenyl)sulfonium.

Examples of the phosphonium salt include arylphosphonium salts, such as a chloride, a bromide, a tetrafluoroborate, a hexafluorophosphate and a hexafluoroantimonate, of phosphoniums, such as tetraphenylphosphonium, ethyltriphenylphosphonium, tetra(p-methoxyphenyl)phosphonium, ethyltri(p-methoxyphenyl)phosphonium and benzyltriphenylphosphonium.

An example of the selenium salt includes a triarylselenium salt such as triphenylselenium hexafluorophosphate.

An example of the iron arene complex compound includes bis($\eta^5$-cyclopentadienyl)($\eta^6$-isopropylbenzene) iron (II) hexafluorophosphate.

A single one of, or a combination of two or more of these photoacid generators can be used.

Examples of the thermal acid generator include a sulfonium salt and a phosphonium salt, and a sulfonium salt is preferably used.

Examples of such compounds include the compounds mentioned above as the examples of the various onium salts of the photoacid generator.

A single one of, or a combination of two or more of these thermal acid generators can be used.

Among these, a sulfonium salt compound or an iodonium salt compound is preferred as (c1) the acid generator, and for example, a compound having an anionic species having strong acidity, such as hexafluorophosphate or hexafluoroantimonate, is preferred.

A content of (c1) the acid generator in the epoxy resin composition of the present invention can be 0.1 parts by mass to 20 parts by mass, or 0.1 parts by mass to 10 parts by mass, and more preferably 0.5 parts by mass to 10 parts by mass with respect to 100 parts by mass of (a) the epoxy component. When the epoxy compound of the formula [1] and a different epoxy compound are used together, the content with respect to 100 parts by mass of all the epoxy compounds falls in the above-mentioned range.

<(c2) Base Generator>

As (c2) the base generator, a photobase generator or a thermal base generator can be used. The photobase generator or the thermal base generator is not especially limited as long as it generates a base (a Lewis base or a Bronsted base) directly or indirectly by light irradiation or heating. An epoxy resin composition containing a thermal base generator can be cured by heating in a short time. Alternatively, an epoxy resin composition containing a photobase generator is cured by light irradiation rather than heating, and hence can be used in a substrate or a portion having low heat resistance.

Examples of the photobase generator include an alkylamine-based photobase generator such as 9-anthrylmethyl N,N- diethylcarbamate; a cycloalkylamine-based photobase generator such as 9-anthryl N,N-dicyclohexylcarbamate, 1-(9,10-anthraquinone-2-yl)ethyl N,N-dicyclohexylcarbamate, dicyclohexylammonium 2-(3-benzoylphenyl)propionate, 9-anthryl N-cyclohexylcarbamate, 1-(9,10-anthraquinone-2-yl)ethyl N-cyclohexylcarbamate, cyclohexylammonium 2-(3-benzoylphenyl)propionate or (E)-N-cyclohexyl-3-(2-hydroxyphenyl)acrylamide; a piperidine-based photobase generator such as 9-anthrylmethyl piperidine-1-carboxylate, (E)-1-piperidino-3-(2-hydroxyphenyl)-2-propen-1-one, (2-nitrophenyl)methyl 4-hydroxypiperidine-1-carboxylate or (2-nitrophenyl)methyl 4-(methacryloyloxy)piperidine-1-carboxylate; a guanidine-based photobase generator such as guanidinium 2-(3-benzoylphenyl)propionate, 1,2-diisopropyl-3-(bis(dimethylamino)methylene)guanidinium 2-(3-benzoylphenyl)propionate, 1,2-dicyclohexyl-4,4,5,5-tetramethylbiguanidium n-butyltriphenylborate or 1,5,7-triazabicyclo[4.4.0]deca-5-enium 2-(9-oxoxanthene-2-yl)propionate; and an imidazole-based photobase generator such as 1-(9,10-anthraquinone-2-yl)ethyl imidazole-1-carboxylate.

A single one of, or a combination of two or more of these photobase generators can be used.

Alternatively, the photobase generator can be obtained as a commercially available product, and for example, photobase generators of WPBG series (WPBG-018, -027, -082, -140, -266, -300 and the like) manufactured by Wako Pure Chemical Industries, Ltd. can be suitably used.

Examples of the thermal base generator include carbamates such as 1-methyl-1-(4-biphenylyl)ethyl carbamate and 2-cyano-1,1-dimethylethyl carbamate; ureas such as urea and N,N-dimethyl-N'-methyl urea; guanidines such as guanidine trichloroacetate, guanidine phenylsulfonylacetate and guanidine phenylpropiolate; dihydropyridines such as 1,4-dihydronicotinamide; dimethylpiperidines such as N-(isopropoxycarbonyl)-2,6-dimethylpiperidine, N-(tert-butoxycarbonyl)-2,6-dimethylpiperidine and N-(benzyloxycarbonyl)-2,6-dimethylpiperidine; quaternary ammonium salts such as tetramethylammonium phenylsulfonylacetate and tetramethylammonium phenylpropiolate; and dicyandiamide. Other examples include U-CAT® SA810, SA831, SA841 and SA851 [all manufactured by San-Apra Ltd.] that are salts of 1,8-diazabicyclo[5.4.0]undeca-7-ene (DBU).

A single one of, or a combination of two or more of these thermal base generators can be used.

A content of (c2) the base generator in the epoxy resin composition of the present invention can be 0.1 parts by mass to 20 parts by mass, or 0.1 parts by mass to 10 parts by mass, and more preferably 0.5 parts by mass to 10 parts by mass with respect to 100 parts by mass of (a) the epoxy component. When the epoxy compound of the formula [1] and a different epoxy compound are used together, the content with respect to 100 parts by mass of all the epoxy compounds falls in the above-mentioned range.

[Method for Preparing Epoxy Resin Composition]

The epoxy resin composition of the present invention is obtained by mixing the epoxy component containing at least the epoxy compound of the formula [1] and the curing agent, and further the curing accelerator if necessary. Alternatively, it is obtained by mixing the epoxy component containing at least the epoxy compound of the formula [1] and the curing catalyst.

The mixing is not especially limited as long as a homogeneous mixture can be obtained, and can be performed, for example, using a reaction flask and an impeller, a mixer or the like.

The mixing is performed under heating if necessary in consideration of viscosity, and is performed at a temperature of 10° C. to 100° C. for 0.5 to 1 hour.

A solid component concentration in the epoxy resin composition of the present invention can be 1% by mass to 100% by mass, or 5% by mass to 100% by mass, or 50% by mass to 100% by mass, or 80% by mass to 100% by mass. Here, a solid component refers to all components excluding a solvent contained in the epoxy resin composition.

In the present invention, the epoxy compound in a liquid form is used and is mixed with the curing agent or the curing catalyst, and therefore, there is basically no need to use a solvent, but a solvent may be added if necessary. For example, the epoxy resin composition can be prepared by dissolving a curing catalyst in a solid form in a solvent such as propylene carbonate, and by mixing the resultant with the epoxy compound in a liquid form. When the curing catalyst is dissolved in the epoxy resin in a liquid form, a general solvent may be added for adjusting the viscosity of the resultant epoxy resin composition.

The thus obtained epoxy resin composition has a suitable viscosity to be used as a liquid sealant. The epoxy resin composition of the present invention can be adjusted to any viscosity, and can partially seal an LED or the like at any position in order that it is used as a transparent sealant by a casting method, a potting method, a dispenser method, a screen printing method, a flexographic printing method, an inkjet printing method or the like. After providing the epoxy resin composition in a liquid form directly on the LED or the like by any of the above-described methods, the resultant is dried and cured to obtain an epoxy resin cured product.

[Epoxy Resin Cured Product]

A cured product obtained from the epoxy resin composition is obtained by applying the epoxy resin composition on a substrate or by pouring the epoxy resin composition into a casting mold on which a releasing agent has been applied, and subjecting the resultant to pre-curing at a temperature of 100° C. to 120° C., and then to main curing (post-curing) at a temperature of 120° C. to 200° C.

The heating time is 1 to 12 hours, and for example, is about 2 to 5 hours for each of the pre-curing and the main curing.

A thickness of a coating film obtained from the epoxy resin composition of the present invention can be selected from a range of about 0.01 μm to 10 mm in accordance with application of the cured product.

In the present invention, the epoxy resin composition including the epoxy component containing at least the epoxy compound of the formula [1], and the photoacid generator or the photobase generator can be applied to a substrate and cured by light irradiation. Besides, heating can be performed before or after the light irradiation.

Alternatively, in the present invention, the epoxy resin composition including the epoxy component containing at least the epoxy compound of the formula [1], and the thermal acid generator or the thermal base generator can be applied to a substrate and cured by heating.

Further alternatively, the epoxy resin composition including the epoxy component containing at least the epoxy compound of the formula [1], and the thermal acid generator and the photoacid generator, or the thermal base generator and the photobase generator can be applied to a substrate and cured by light irradiation after heating.

Examples of a method for applying the epoxy resin composition of the present invention to a substrate include a flow coating method, a spin coating method, a spray coating method, a screen printing method, a flexographic printing method, an inkjet printing method, a casting method, a bar coating method, a curtain coating method, a roll coating method, a gravure coating method, a dipping method and a slitting method.

The thickness of a coating film formed from the epoxy resin composition of the present invention can be selected from the range of about 0.01 µm to 10 mm in accordance with the application of a cured product. For example, when the coating film is used as a photoresist, the thickness can be about 0.05 µm to 10 µm (0.1 µm to 5 µm in particular), when it is used in a printed wiring board, the thickness can be about 10 µm to 5 mm (100 µm to 1 mm in particular), and when it is used as an optical thin film, the thickness can be about 0.1 µm to 100 µm (0.3 µm to 50 µm in particular).

Examples of the light used for irradiation or exposure in using a photoacid generator or a photobase generator include gamma-rays, X-rays, UV and visible rays, and visible rays or UV, and UV in particular, is usually used in many cases.

The wavelength of the light is, for example, 150 nm to 800 nm, preferably 150 nm to 600 nm, more preferably 200 nm to 400 nm, and particularly preferably about 300 nm to 400 nm.

A light amount for the irradiation is varied depending on the thickness of the coating film, and can be, for example, 2 mJ/cm$^2$ to 20,000 mJ/cm$^2$, and preferably about 5 mJ/cm$^2$ to 5,000 mJ/cm$^2$.

A light source can be selected in accordance with the type of the rays used for the exposure. For example, in using UV, a low pressure mercury lamp, a high pressure mercury lamp, an ultrahigh pressure mercury lamp, a deuterium lamp, a halogen lamp, laser light (such as helium-cadmium laser or excimer laser), a UV-LED and the like can be used. Through the irradiation of such light, a curing reaction of the composition proceeds.

When a thermal acid generator or a thermal base generator is used, or if necessary after the light irradiation using a photoacid generator or a photobase generator, heating is performed, for example, at room temperature (about 23° C.) to about 250° C. The heating time can be selected from a range of 3 seconds or more (for example, about 3 seconds to 5 hours), and is, for example, about 5 seconds to 2 hours.

Besides, when a pattern or an image is to be formed (for example, when a printed wiring board or the like is to be produced), the coating film formed on the substrate may be subjected to pattern exposure. The pattern exposure may be performed by laser light scanning, or may be performed by light irradiation through a photomask. A pattern or an image can be formed by developing (or dissolving), with a developer, a non-irradiated region (an unexposed portion) formed by the pattern exposure.

As the developer, an alkaline aqueous solution or an organic solvent can be used.

Examples of the alkaline aqueous solution include an aqueous solution of an alkali metal hydroxide such as potassium hydroxide, sodium hydroxide, potassium carbonate or sodium carbonate; an aqueous solution of a quaternary ammonium hydroxide such tetramethylammonium hydroxide, tetraethylammonium hydroxide or choline; and an amine aqueous solution of ethanolamine, propylamine or ethylenediamine.

The alkaline developer is in the form of an aqueous solution of 10% by mass or less in general, and preferably, an aqueous solution of 0.1% by mass to 3% by mass or the like is used. Besides, an alcohol or a surfactant can be added to the developer to be used, and an addition amount of each of such components is preferably 0.05 parts by mass to 10 parts by mass with respect to 100 parts by mass of the developer. Specifically, a 0.1% by mass to 2.38% by mass aqueous solution of tetramethylammonium hydroxide or the like can be used.

Besides, as the organic solvent used as the developer, a general organic solvent can be used, and examples thereof include aromatic hydrocarbons such as toluene; esters such as ethyl lactate, propylene glycol monomethyl ether acetate (PGMEA), propylene glycol monoethyl ether acetate, propylene glycol monopropyl ether acetate and propylene glycol monobutyl ether acetate; amides such as N,N-dimethylformamide (DMF); nitriles such as acetonitrile; ketones such as acetone and cyclohexanone; and alcohols such as methanol, ethanol, 2-propanol, propylene glycol monomethyl ether (PGME), propylene glycol monoethyl ether, propylene glycol monopropyl ether and propylene glycol monobutyl ether. Single one of, or a mixture of two or more of these can be used.

In particular, ethyl lactate, propylene glycol monomethyl ether acetate (PGMEA), propylene glycol monomethyl ether (PGME) or the like can be preferably used.

[Solvent]

The epoxy resin composition of the present invention may contain a solvent if necessary.

Examples of the solvent that can be used in the present invention include aromatic hydrocarbons such as toluene and xylene; esters such as methyl acetate, ethyl acetate, propyl acetate and butyl acetate; hydroxyesters such as methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-2-methylpropionate, ethyl 2-hydroxy-2-methylpropionate and methyl 2-hydroxy-3-methylbutanoate; ether esters such as methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, methyl cellosolve acetate, ethyl cellosolve acetate, propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, propylene glycol monopropyl ether propionate and propylene glycol monobutyl ether propionate; ketones such as methyl ethyl ketone (MEK), 4-hydroxy-4-methyl-2-pentanone and cyclohexanone; alcohols such as ethylene glycol monomethyl ether, ethylene glycol monoethyl ether, diethylene glycol monomethyl ether, diethylene glycol monoethyl ether, propylene glycol monomethyl ether (PGME), propylene glycol monoethyl ether, propylene glycol monopropyl ether and propylene glycol monobutyl ether; and ethers such as tetrahydrofuran (THF), diethylene glycol dimethyl ether, diethylene glycol diethyl ether and diethylene glycol ethyl methyl ether.

[Another Curable Monomer]

The epoxy resin composition of the present invention may contain, as a cationically curable monomer, a vinyl group-containing compound, an oxetanyl group-containing compound or the like for purposes of viscosity adjustment or curability improvement of a curable composition.

The vinyl group-containing compound is not especially limited as long as it is a compound having vinyl group, and examples thereof include vinyl ether compounds such as 2-hydroxyethyl vinyl ether (HEVE), diethylene glycol monovinyl ether (DEGV), 2-hydroxybutyl vinyl ether (HBVE) and triethylene glycol divinyl ether. Alternatively, a vinyl compound having a substituent such as alkyl group or allyl group in the α position and/or β position can be used. Alternatively, a vinyl ether compound having a cyclic ether group such as epoxy group and/or oxetanyl group can be used, and examples thereof include oxynorbornene divinyl ether and oxetane-3,3-dimethanol divinyl ether.

Alternatively, a compound having vinyl group and (meth)acrylic group can be used, and examples thereof include 2-(2-vinyloxyethoxy)ethyl (meth)acrylate.

A single one of, or a combination of two or more of these vinyl group-containing compounds can be used.

The oxetanyl group-containing compound is not especially limited as long as it is a compound having oxetanyl group, and examples thereof include oxetane compounds such as 3-ethyl-3-(hydroxymethyl)oxetane (OXA), 3-ethyl-3-(phenoxymethyl)oxetane (POX), bis((3-ethyl-3-oxetanyl)methyl) ether (DOX), 1,4-bis(((3-ethyl-3-oxetanyl)methoxy)methyl)benzene (XDO), 3-ethyl-3-(2-ethylhexyloxymethyl)oxetane (EHOX), 3-ethyl-3-((3-triethoxysilylpropoxy)methyl)oxetane (TESOX), oxetanylsilsesquioxane (OX-SQ) and phenol novolac oxetane (PNOX-1009).

Alternatively, a compound having oxetanyl group and (meth)acrylic group can be used, and examples thereof include (3-ethyl-3-oxetanyl)methyl (meth)acrylate.

A single one of, or a combination of two or more of these oxetanyl group-containing compounds can be used.

[Other Components]

The epoxy resin composition of the present invention may contain a usual additive if necessary. Examples of such an additive include a surfactant, an adhesion promoter, a sensitizer, a thickener, an antifoaming agent, a leveling agent, a coating property improving agent, a lubricant, a stabilizer (an antioxidant, a heat stabilizer, a light stabilizer or the like), a plasticizer, a dissolution accelerator, an antistatic agent, a filler, a pigment and a colorant. Single one of, or a combination of two or more of these additives may be used.

To the epoxy resin composition of the present invention, a surfactant may be added for purposes of improvement of a coating property. Examples of such a surfactant include, but are not especially limited to, a fluorine-based surfactant, a silicone-based surfactant and a nonionic surfactant. Single one of, or a combination of two or more of these surfactants can be used.

Among these surfactants, a fluorine-based surfactant is preferred because of its high effect of improving a coating property. Specific examples of the fluorine-based surfactant include, but are not limited to, EFTOP® EF-301, EF-303 and EF-352 [all manufactured by Mitsubishi Materials Electronic Chemicals Co., Ltd.], MEGAFACE® F-171, F-173, F-482, R-08, R-30, R-90 and BL-20 [all manufactured by DIC Corporation], Fluorad FC-430 and FC-431 [all manufactured by 3M Japan Ltd.], AsahiGuard® AG-710 [manufactured by Asahi Glass Co., Ltd.] and SURFLON S-382, SC-101, SC-102, SC-103, SC-104, SC-105 and SC-106 [all manufactured by AGC Seimi Chemical Co., Ltd.].

An addition amount of the surfactant in the epoxy resin composition of the present invention is 0.01% by mass to 5% by mass, preferably 0.01% by mass to 3% by mass, and more preferably 0.01% by mass to 2% by mass based on the content of the solid component of the epoxy resin composition.

To the epoxy resin composition of the present invention, an adhesion promoter may be added for purposes of, for example, improvement of adhesiveness to a substrate after development. Examples of the adhesion promoter include chlorosilanes such as chlorotrimethylsilane, trichloro(vinyl)silane, chloro(dimethyl)(vinyl)silane, chloro(methyl)(diphenyl)silane and chloro(chloromethyl)(dimethyl)silane; alkoxysilanes such as methoxytrimethylsilane, dimethoxydimethylsilane, diethoxydimethylsilane, ethoxy(dimethyl)(vinyl)silane, dimethoxydiphenylsilane, triethoxy(phenyl)silane, 3-chloropropyltrimethoxysilane, 3-aminopropyltriethoxysilane, 3-(meth)acryloyloxypropyltrimethoxysilane, 3-glycidyloxypropyltrimethoxysilane and trimethoxy(3-(N-piperidinyl)propyl)silane; silazanes such as hexamethyldisilazane, N,N'-bis(trimethylsilyl)urea, dimethyl(trimethylsilyl)amine and trimethylsilylimidazole; nitrogen-containing heterocyclic compounds such as imidazole, indazole, benzimidazole, benzotriazole, mercaptoimidazole, mercaptopyrimidine, 2-mercaptobenzimidazole, 2-mercaptobenzoxazole, 2-mercaptobenzothiazole, urazole and thiouracil; and ureas and thioureas such as 1,1-dimethylurea and 1,3-dimethylurea. A single one of, or a combination of two or more of these adhesion promoters can be used.

An addition amount of the adhesion promoter in the epoxy resin composition of the present invention is usually 20% by mass or less, preferably 0.01% by mass to 10% by mass, and more preferably 0.05% by mass to 5% by mass based on the content of the solid component of the epoxy resin composition.

To the epoxy resin composition of the present invention, a sensitizer may be added. Examples of a usable sensitizer include anthracene, phenothiazene, perylene, thioxanthone and benzophenone thioxanthone. Besides, examples of a sensitizing dye include a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye and a pyrylium salt-based dye. The anthracene-based sensitizer is particularly preferred, and when used together with a cationically curable catalyst (a radiation sensitive cationic polymerization initiator), its sensitivity is remarkably improved and it has a function to initiate radical polymerization, and for example, when a hybrid type system using both a cationic cure system and a radical cure system is employed, catalyst species can be simple. As specific examples of the anthracene compound, dibutoxyanthracene, dipropoxyanthraquinone and the like are effective.

Besides, examples of a sensitizer used in the case of using a base generator as the curing catalyst include acetophenones, benzoins, benzophenones, anthraquinones, xanthones, thioxanthones, ketals and tertiary amines.

An addition amount of the sensitizer in the epoxy resin composition of the present invention is 0.01% by mass to 20% by mass, and preferably 0.01% by mass to 10% by mass based on the content of the solid component of the epoxy resin composition.

[Composition for Coating Metal Wiring]

A composition for coating a metal wiring, which contains the epoxy resin composition, is also involved in the present invention.

The metal wiring of the present invention is not especially limited as long as it is a wiring formed from a metal such as aluminum, nickel, copper, platinum, gold, palladium, silver or tin, or a metal oxide such as antimony-doped tin oxide (ATO), aluminum-doped zinc oxide (AZO), fluorine-doped tin oxide (FTO), gallium-doped zinc oxide (GZO) or tin-doped indium oxide (ITO), which are usually used for a metal wiring.

When the epoxy resin composition is applied and cured on a substrate having the metal wiring thereon, a wiring board in which the cured product of the epoxy resin composition and the metal wiring are in contact with each other can be obtained. It is noted that the epoxy resin composition is applied and cured in the same manner as described above. The wiring board thus obtained is also involved in the present invention.

EXAMPLES

The present invention will now be more specifically described with reference to examples, and it is noted that the present invention is not limited to the following examples.

In the examples, apparatuses and conditions employed in preparation of samples and analysis of properties are as follows:

(1) Viscosity

Apparatus: TVE-22L, TVE-25H, manufactured by Told Sangyo Co., Ltd.

(2) Melting Point

Apparatus: Diamond DSC, manufactured by Perkin Elmer Co., Ltd.

(3) Epoxy Equivalent

Apparatus: Automatic Potentiometric Titrator AT-510, manufactured by Kyoto Electronics Manufacturing Co., Ltd.

(4) Relative Dielectric Constant

Apparatus: E4980A Precision LCR Meter, manufactured by Keysight Technologies Inc.

Sample Holder: Room Temperature Sample Holder of 12962 Model, manufactured by Toyo Corporation (5) Oven Apparatus: Low-temperature Blowing Thermostat Oven DNF400, manufactured by Yamato Scientific Co., Ltd.

The abbreviations mean the following:

OEO: 7-octen-1-ol [manufactured by Kuraray Co., Ltd., purity of 95%]

DEO: 9-decen-1-ol [manufactured by Tokyo Chemical Industry Co., Ltd.]

UdEO: 10-undecen-1-ol [manufactured by Tokyo Chemical Industry Co., Ltd.]

TEA: triethylamine [manufactured by Junsei Chemical Co., Ltd.]

MsCl: methanesulfonyl chloride [manufactured by Tokyo Chemical Industry Co., Ltd.]

ICA: isocyanuric acid [manufactured by Nissan Chemical Industries, Ltd.]

mCPBA: m-chloroperbenzoic acid [manufactured by Wako Pure Chemical Industries, Ltd., purity of 70%]

CEL: (3,4-epoxycyclohexyl)methyl 3,4-epoxycyclohexanecarboxylate [Celloxide 2021P, manufactured by Daicel Corporation]

TEPeIC: tris(4,5-epoxypentyl) isocyanurate [TEPIC®-VL, manufactured by Nissan Chemical Industries, Ltd.]

TGIC: triglycidyl isocyanurate [TEPIC®-L, manufactured by Nissan Chemical Industries, Ltd.]

MH700: mixture of 4-methylhexahydrophthalic anhydride and hexahydrophthalic anhydride (molar ratio of 70:30) [Rikacid® MH-700, manufactured by New Japan Chemical Co., Ltd.]

PX4ET: tetrabutylphosphonium O,O-diethylphosphorodithioate [Hishicolin® PX-4ET, manufactured by Nippon Chemical Industrial Co., Ltd.]

DMSO: dimethyl sulfoxide

[Production Example 1] Production of tris(7,8-epoxyoctyl) isocyanurate (TEOIC)

A reaction flask was charged with 100.0 g (net amount of 0.74 mol) of OEO, 94.7 g (0.94 mol) of TEA and 400 g of chloroform. To the resultant solution, 107.21 g (0.94 mol) of MSCl was slowly added in a dropwise manner with stirring in an ice bath, and the resultant was stirred for another 1 hour.

The resultant reaction solution was washed with 5% by mass sodium bicarbonate water and with deionized water, and then the solvent was distilled off. The thus obtained residue was purified by silica gel chromatography (hexane:ethyl acetate=75:25 (in a volume ratio)) to obtain 146.1 g of 7-octenyl methanesulfonate (OEOMs).

A reaction flask was charged with 70.0 g (0.34 mol) of the OEOMs, 36.0 g (0.34 mol) of sodium carbonate [manufactured by Junsei Chemical Co., Ltd.], 4.0 g (0.034 mol) of KBr [manufactured by Wako Pure Chemical Industries, Ltd.] and 350 g of DMSO. To the resultant solution, 14.0 g (0.11 mol) of ICA was added with stirring at 55° C., and the resultant was stirred for another 12 hours.

To the resultant reaction solution, 140 g of heptane and 30.6 g (0.51 mol) of acetic acid were added, and the resultant was washed with 300 g of deionized water twice, and then the solvent was distilled off. The thus obtained residue was purified by the silica gel chromatography (hexane:ethyl acetate=95:5 (in a volume ratio)) to obtain 35.6 g of tris(7-octenyl) isocyanurate (TOEIC).

A reaction flask was charged with 34.6 g (0.08 mol) of the TOEIC and 670 g of chloroform. To the resultant solution, 72.4 g (net amount of 0.29 mol) of mCPBA was added with stirring, and the resultant was stirred at room temperature (about 23° C.) for 90 hours.

To the resultant reaction solution, 300 mL of a 10% by mass aqueous solution of sodium thiosulfate was added to decompose the mCPBA. The resultant organic phase was washed with a 5% by mass aqueous solution of sodium bicarbonate and with a 5% by mass saline solution, and then the solvent was distilled off. The thus obtained residue was purified by the silica gel chromatography (hexane:ethyl acetate=80:20 (in a volume ratio)) to obtain 22.8 g of a target product of tris(7,8-epoxyoctyl) isocyanurate (TEOIC) in the form of a colorless transparent liquid. The thus obtained TEOIC had a viscosity of 680 mPa·s (25° C.), and an epoxy equivalent, measured in accordance with JIS K7236:2009, of 171.

[Comparative Production Example 1] Production of tris(9,10-epoxydecyl) isocyanurate (TEDIC)

A reaction flask was charged with 100.0 g (0.64 mol) of DEO, 77.8 g (0.77 mol) of TEA and 400 g of chloroform. To the resultant solution, 88.1 g (0.77 mol) of MsCl was slowly added in a dropwise manner with stirring in an ice bath, and the resultant was stirred for another 1 hour.

The resultant reaction solution was washed with 5% by mass sodium bicarbonate water and with deionized water, and then the solvent was distilled off. The thus obtained residue was purified by the silica gel chromatography (hexane:ethyl acetate=75:25 (in a volume ratio)) to obtain 143.9 g of 9-decenyl methanesulfonate (DEOMs).

A reaction flask was charged with 66.0 g (0.28 mol) of the DEOMs, 42.5 g (0.31 mol) of potassium carbonate [manufactured by Junsei Chemical Co., Ltd], 3.7 g (0.031 mol) of KBr [manufactured by Wako Pure Chemical Industries, Ltd.] and 550 g of DMSO. To the resultant solution, 11.0 g (0.085 mol) of ICA was added with stirring at 55° C., and the resultant was stirred for another 12 hours.

To the resultant reaction solution, 132 g of heptane and 25.4 g (0.42 mol) of acetic acid were added, the resultant was washed with 300 g of deionized water twice, and then the solvent was distilled off. The thus obtained residue was purified by the silica gel chromatography (hexane:ethyl acetate=90:10 (in a volume ratio)) to obtain 23.1 g of tris(9-decenyl) isocyanurate (TDEIC).

A reaction flask was charged with 23.1 g (0.042 mol) of the TDEIC and 440 g of chloroform. To the resultant solution, 40.9 g (net amount of 0.17 mol) of mCPBA was added with stirring, and the resultant was stirred at room temperature (about 23° C.) for 90 hours.

To the resultant reaction solution, 300 mL of a 10% by mass aqueous solution of sodium thiosulfate was added to decompose the mCPBA. The resultant organic phase was washed with a 5% by mass aqueous solution of sodium bicarbonate and a 5% by mass saline solution, and then the solvent was distilled off. The thus obtained residue was purified by the silica gel chromatography (hexane:ethyl acetate=85:15 (in a volume ratio)) to obtain 22.0 g of a target product of tris(9,10-epoxydecyl) isocyanurate (TEDIC) in the form of a white solid. The thus obtained TEDIC had a melting point of 26° C. and an epoxy equivalent of 196.

[Comparative Production Example 2] Production of tris(10,11-epoxyundecyl) isocyanurate (TEUdIC)

A reaction flask was charged with 100.0 g (0.59 mol) of UdEO, 77.3 g (0.76 mol) of TEA and 590 g of chloroform. To the resultant solution, 80.7 g (0.70 mol) of MSCl was slowly added in a dropwise manner with stirring in an ice bath, and the resultant was stirred for another 1 hour.

The resultant reaction solution was washed with 5% by mass sodium bicarbonate water and with deionized water, and then the solvent was distilled off to obtain 145.9 g of 10-undecenyl methanesulfonate (UdEOMs).

A reaction flask was charged with 140.0 g (0.56 mol) of the UdEOMs, 85.0 g (0.61 mol) of potassium carbonate [manufactured by Junsei Chemical Co., Ltd], 7.3 g (0.061 mol) of KBr [manufactured by Wako Pure Chemical Industries, Ltd.] and 550 g of DMSO. To the resultant solution, 22.1 g (0.17 mol) of ICA was added with stirring at 55° C., and the resultant was stirred for another 12 hours.

The resultant reaction solution was filtered to remove an insoluble matter. To the resultant filtrate, 250 g of hexane was added, the resultant was washed with 250 g of a 5% by mass saline solution and with 500 g of a 5% by mass saline solution, and then the solvent was distilled off. The thus obtained residue was purified by the silica gel chromatography (hexane:ethyl acetate=90:10 (in a volume ratio)) to obtain 34.1 g of tris(10-undecenyl) isocyanurate (TUdEIC).

A reaction flask was charged with 34.1 g (0.058 mol) of the TUdEIC and 500 g of chloroform. To the resultant solution, 55.9 g (net amount of 0.23 mol) of mCPBA was added with stirring, and the resultant was stirred at room temperature (about 23° C.) for 30 hours.

To the resultant reaction solution, 300 mL of a 10% by mass aqueous solution of sodium thiosulfate was added to decompose the mCPBA. The resultant organic phase was washed with a 5% by mass aqueous solution of sodium bicarbonate and a 5% by mass saline solution, and then the solvent was distilled off. The thus obtained residue was purified by the silica gel chromatography (hexane:ethyl acetate=75:25 (in a volume ratio)) to obtain 23.1 g of a target product of tris(10,11-epoxyundecyl) isocyanurate (TEUdIC) in the form of a white solid. The thus obtained TEUdIC had a melting point of 43° C. and an epoxy equivalent of 211.

Viscosities at 25° C. of the epoxy compounds produced in Production Example 1 and Comparative Production Examples 1 and 2, and TEPeIC, that is, a general-purpose low viscosity epoxy compound, are shown in Table 1.

TABLE 1

| | $R^1, R^2, R^3$ in Formula [1] | $L^1, L^2, L^3$ in Formula [1] | Viscosity [mPa · s] |
|---|---|---|---|
| TEOIC | H | hexamethylene | 680 |
| TEPeIC | H | trimethylene | 7,800 |
| TEDIC | H | octamethylene | solid (melting point: 26° C.) |
| TEUdIC | H | nonamethylene | solid (melting point: 43° C.) |

As shown in Table 1, the epoxy compound (TEOIC) used in the present invention had a remarkably lower viscosity than the general-purpose low viscosity epoxy compound (TEPeIC), and thus it was suggested to be excellent not only in handleability but also in properties such as a coating property and a burying property.

On the other hand, it was confirmed that the epoxy compounds (TEDIC and TEUdIC) having a similar skeleton but having $L^1$ to $L^3$ of longer (C8 and C9) alkylene groups is not in the form of a liquid but in the form of a solid.

Examples 1 to 3 and Comparative Examples 1 to 3

To 100 parts by mass of each epoxy component shown in Table 2, MH700 used as a curing agent in an amount equimolar to epoxy group of the epoxy compound and 1 part by mass of PX4ET used as a curing accelerator were added. The resultant mixture was stirred under reduced pressure at room temperature (about 23° C.) for 30 minutes for defoaming, and thus, each of epoxy resin compositions 1 to 6 was prepared.

Each of the epoxy resin compositions was sandwiched, together with a U-shaped silicone rubber spacer with a thickness of 3 mm, between two glass substrates, which had been precedently subjected to a release treatment with Optool® DSX [manufactured by Daikin Industries, Ltd.]. The resultant was heated (for pre-curing) in an oven at 100° C. for 2 hours, and then heated (for main curing) with the temperature increased to 150° C. for 5 hours. The resultant was slowly cooled, and the glass substrates were removed to obtain a cured product with a thickness of 3 mm.

The thus obtained cured products were evaluated for a relative dielectric constant. For obtaining the relative dielectric constant, capacitance Cp in applying a voltage of 1 V and 1 MHz to a test piece sandwiched between electrodes of a holder was measured, and was divided by capacitance $C_0$ of the air measured under the same conditions. The results are also shown in Table 2.

TABLE 2

| | Epoxy Resin Composition | Epoxy Component | | MH700 [parts by mass] | PX4ET [parts by mass] | Relative Dielectric Constant |
|---|---|---|---|---|---|---|
| | | | [parts by mass] | | | |
| Example 1 | Epoxy Resin Composition 1 | TEOIC | 100 | 97 | 1 | 2.93 |
| Example 2 | Epoxy Resin Composition 3 | TEOIC TGIC | 50 50 | 129 | 1 | 3.19 |
| Example 3 | Epoxy Resin Composition 4 | TEOIC CEL | 50 50 | 111 | 1 | 3.12 |
| Comparative Example 1 | Epoxy Resin Composition 2 | TEPeIC | 100 | 127 | 1 | 3.21 |
| Comparative Example 2 | Epoxy Resin Composition 5 | TGIC | 100 | 165 | 1 | 3.51 |
| Comparative Example 3 | Epoxy Resin Composition 6 | CEL | 100 | 131 | 1 | 3.33 |

As shown in Table 2, the cured product obtained from the epoxy resin composition of the present invention exhibited an extremely low relative dielectric constant as compared with the cured product obtained by using the general-purpose low viscosity epoxy compound of the TEPeIC (Example 1 and Comparative Example 1).

Besides, it was confirmed that the relative dielectric constant of the cured product of the general-purpose epoxy compound can be lowered when the specific epoxy compound contained in the epoxy resin composition of the present invention is contained (Example 2 and Comparative Example 2, and Example 3 and Comparative Example 3).

INDUSTRIAL APPLICABILITY

An epoxy resin composition of the present invention has a photo- and thermo-curing property, and can be widely used in the fields of electronic materials such as an adhesive, a high refractive index layer of an anti-reflective coating (such as an anti-reflective coating for a liquid crystal display), an optical thin film (such as a reflector), a sealant for an electronic component, a printed wiring board and an interlayer insulating film material (such as an interlayer insulating film material for a build-up printed board) and the like. In particular, it can be widely used as an electronic material required of having a low dielectric constant, such as a printed wiring board or an interlayer insulating film material.

The epoxy resin composition of the present invention can be suitably used as a main agent, a crosslinking agent, a diluent, a leveling agent or a compatibilizer in various materials such as a semiconductor sealing material, a transparent sealant, an adhesive for an electronic material, an optical adhesive, a printed wiring board material, an interlayer insulating film material, fiber reinforced plastic, an ink for laser beam lithography, a printing ink, a water-repellent coating material, a water-slippery coating material, a lipophilic coating material, a self-repairing material, a biocompatible material, a birefringence control material, a pigment dispersant, a filler dispersant and a rubber modifier.

The invention claimed is:

1. An epoxy resin composition comprising:
   (a) an epoxy component containing at least an epoxy compound of formula [1]; and
   (b) a curing agent,

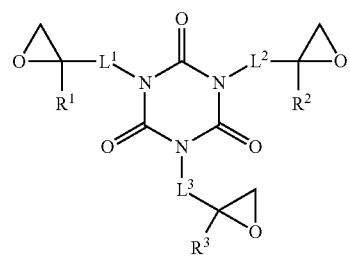

[1]

where:
   each of $R^1$ to $R^3$ is a hydrogen atom, and
   each of $L^1$ to $L^3$ each is a hexamethylene group, and
   wherein the epoxy resin composition optionally includes an acid generator as a curing catalyst in addition to the curing agent but not as the curing agent.

2. The epoxy resin composition according to claim 1, wherein (b) the curing agent is at least one selected from the group consisting of an acid anhydride, an amine, a phenol resin, a polyamide resin, imidazoles and a polymercaptan.

3. The epoxy resin composition according to claim 2, wherein (b) the curing agent is an acid anhydride.

4. The epoxy resin composition according to claim 1, wherein (b) the curing agent is contained in a proportion of 0.5 to 1.5 equivalents per equivalent of epoxy group of (a) the epoxy component.

5. A composition for coating a metal wiring, comprising the epoxy resin composition according to claim 1.

6. A cured product of the epoxy resin composition according to claim 1.

7. A wiring board, comprising a cured product of the epoxy resin composition according to claim 1, and a metal wiring, wherein the cured product and the metal wiring are in contact with each other.

* * * * *